(12) United States Patent
Ng et al.

(10) Patent No.: US 12,347,789 B2
(45) Date of Patent: Jul. 1, 2025

(54) AIR-CORE TRANSFORMER PACKAGE WITH FERRITE ELECTRO-MAGNETIC INTERFERENCE (EMI) SHIELDING OF INTEGRATED-CIRCUIT (IC) CHIP

(71) Applicant: High Tech Technology Limited, Hong Kong (HK)

(72) Inventors: Chik Wai (David) Ng, Hong Kong (HK); Kwun Yuan (Godwin) Ho, Hong Kong (HK); Ki Hin (Gary) Choi, Hong Kong (HK); Tin Ho (Andy) Wu, Hong Kong (HK); Wai Kit (Victor) So, Hong Kong (HK)

(73) Assignee: HIGH TECHNOLOGY LIMITED, Hong Kong (HK)

( * ) Notice: Subject to any disclaimer, the term of this patent is extended or adjusted under 35 U.S.C. 154(b) by 637 days.

(21) Appl. No.: 17/693,576

(22) Filed: Mar. 14, 2022

(65) Prior Publication Data
US 2023/0290736 A1    Sep. 14, 2023

(51) Int. Cl.
*H01L 23/552*    (2006.01)
*H01L 23/00*    (2006.01)
(Continued)

(52) U.S. Cl.
CPC ...... *H01L 23/552* (2013.01); *H01L 23/49861* (2013.01); *H01L 23/645* (2013.01);
(Continued)

(58) Field of Classification Search
CPC ............. H01L 23/552; H01L 23/49861; H01L 23/645; H01L 23/49816; H01L 23/49822;
(Continued)

(56) References Cited

U.S. PATENT DOCUMENTS

| 5,428,245 | A | 6/1995 | Lin et al. |
| 6,501,364 | B1 | 12/2002 | Hui et al. |
| | | (Continued) | |

FOREIGN PATENT DOCUMENTS

| CN | 101064208 A | 10/2007 |
| CN | 103247596 A | 8/2013 |
| | (Continued) | |

OTHER PUBLICATIONS

Mohan, M. del Mar Hershenson, S. P. Boyd and T. H. Lee, "Simple accurate expressions for planar spiral inductances", IEEE Journal of Solid-State Circuits, vol. 34, No. 10, pp. 1419-1424, Oct. 1999.

*Primary Examiner* — Teresa M. Arroyo
(74) *Attorney, Agent, or Firm* — gPatent LLC; Stuart T. Auvinen

(57) ABSTRACT

An Integrated Circuit (IC) package has a ferrite-dielectric shield between planar transformer coils and a semiconductor chip. The shield blocks Electro-Magnetic Interference (EMI) generated by currents in transformer coils from reaching the semiconductor chip. Multiple layers of planar transformer coils serve as primary or secondary coils and can be connected together in series or parallel using center posts and coil extensions from outer coil windings to lead-frame risers that also have external package connectors such as pins or bonding balls. The center winding of an upper transformer coil connects to the semiconductor chip on a die attach pad through a center post that fits through an opening in the shield that is over the air core center of the transformer coil. Bonding wires connect pads on the semiconductor chip to lead-frame pads on lead-frame risers that end at external package connectors.

11 Claims, 16 Drawing Sheets

(51) Int. Cl.
*H01L 23/498* (2006.01)
*H01L 23/64* (2006.01)

(52) U.S. Cl.
CPC .............. *H01L 24/16* (2013.01); *H01L 24/48* (2013.01); *H01L 2224/16221* (2013.01); *H01L 2224/48249* (2013.01); *H01L 2224/48257* (2013.01); *H01L 2924/182* (2013.01); *H01L 2924/3025* (2013.01)

(58) Field of Classification Search
CPC ... H01L 23/12; H01L 23/481; H01L 23/4824; H01L 23/488; H01L 23/49; H01L 23/495; H01L 23/49537; H01L 23/498; H01L 23/52; H01L 23/522; H01L 23/60; H01L 24/45; H01L 24/49; H01L 24/16; H01L 24/48; H01L 2224/16221; H01L 2224/48249; H01L 2224/48257; H01L 2224/48091; H01L 2224/49171; H01L 2224/81; H01L 2924/182; H01L 2924/3025; H01L 2924/15311; H01L 2924/3511; H01L 2924/00014; H01F 27/36; H01F 27/2871; H01F 27/288; H01F 2027/2819; H01F 27/2804; H01F 27/366; H10D 86/80

See application file for complete search history.

(56) References Cited

U.S. PATENT DOCUMENTS

| 9,001,524 | B1 | 4/2015 | Akre | |
| 2013/0181534 | A1* | 7/2013 | Jin | H01L 23/48 |
| | | | | 307/104 |
| 2017/0178787 | A1* | 6/2017 | Massolini | H01F 27/288 |
| 2020/0227349 | A1 | 7/2020 | Zhai | |
| 2021/0091016 | A1* | 3/2021 | Zhang | H10D 1/20 |

FOREIGN PATENT DOCUMENTS

| EP | 0707743 B1 | 7/1999 | |
| WO | WO1998028637 A2 | 7/1998 | |
| WO | WO-2010010769 A1 * | 1/2010 | ......... H01F 27/2804 |

* cited by examiner

AIR-CORE TRANSFORMER PACKAGE WITH FERRITE ELECTRO-MAGNETIC INTERFERENCE (EMI) SHIELDING OF INTEGRATED-CIRCUIT (IC) CHIP

FIELD OF THE INVENTION

This invention relates to semiconductor-transformer packages, and more particularly to a package with a semiconductor chip shielded from an integrated transformer.

BACKGROUND OF THE INVENTION

Semiconductor chips are widely used and are often packaged in a lead-frame plastic package. Bonding wires are placed between bonding pads on the semiconductor chip and bonding pads on the lead frame. Then the lead frame and chip are encapsulated with plastic that covers and protects the bonding wires as well as the chip and lead frame. Ends of the lead frame protrude from the plastic to form pins. An electrical path is provide from the pins, through the lead frame to the lead-frame bonding pad, through the bonding wires and to the bonding pads on the chip.

While transistors, resistors, and capacitors are easily integrated together in the semiconductor chip using technologies such as Complementary Metal-Oxide-Semiconductor (CMOS) processes, transformers are not since inductance values would be too small or the area penalty too high.

External transformers are often used. Typically metal wires are wrapped many times around a metal core. Air core transformers have a lower inductance than metal-core transformers, but are easier to make. An air core transformer may be formed by a small, flat spiral coil. This planar transformer would have a low energy loss and be useful for high frequency switching, but the inductance would be too low for some applications such as power converters.

Such a planar air-core transformer might physically be able to be integrated with a semiconductor chip, perhaps in a single package. However, the transformer coil produces an electro-magnetic field that can induce currents in nearby metal wires. When the transformer is placed near a semiconductor chip, the electromagnetic field can induce unwanted currents in metal traces in the semiconductor chip. These unwanted currents can interfere with desired signals and cause the semiconductor chip to operate improperly. For higher inductances and coil currents, and close spacings to the chip, the inducted currents in the chip could even damage the chip. Thus such Electro-Magnetic Interference (EMI) generated by the coil can prevent integration with a chip in a semiconductor package.

The package can be made larger so that the semiconductor chip and the transformer are spaced apart far enough that the EMI does not harm the semiconductor chip. However, this spacing may be several times the size of the transformer or chip. The package would have to be many times larger than is desirable.

Multi-chip modules might be able to have an integrated transformer, but these modules are many times larger than a single-chip package. Such large modules are costly and take up too much area on a Printed Circuit Board (PCB) that they would be mounted to. Certain applications such as Internet-of-Things (IoT) are area and cost constrained, preventing the use of large packages.

What is desired is a semiconductor package containing both a semiconductor chip and a transformer. It is desired to shield the semiconductor chip from the EMI generated by the coil. It is further desired to boost the inductance of the coil. It is desired to add a structure to a semiconductor package that both shields the chip from EMI and boosts the inductance of the transformer.

DETAILED DESCRIPTION

The present invention relates to an improvement in semiconductor-transformer packaging. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
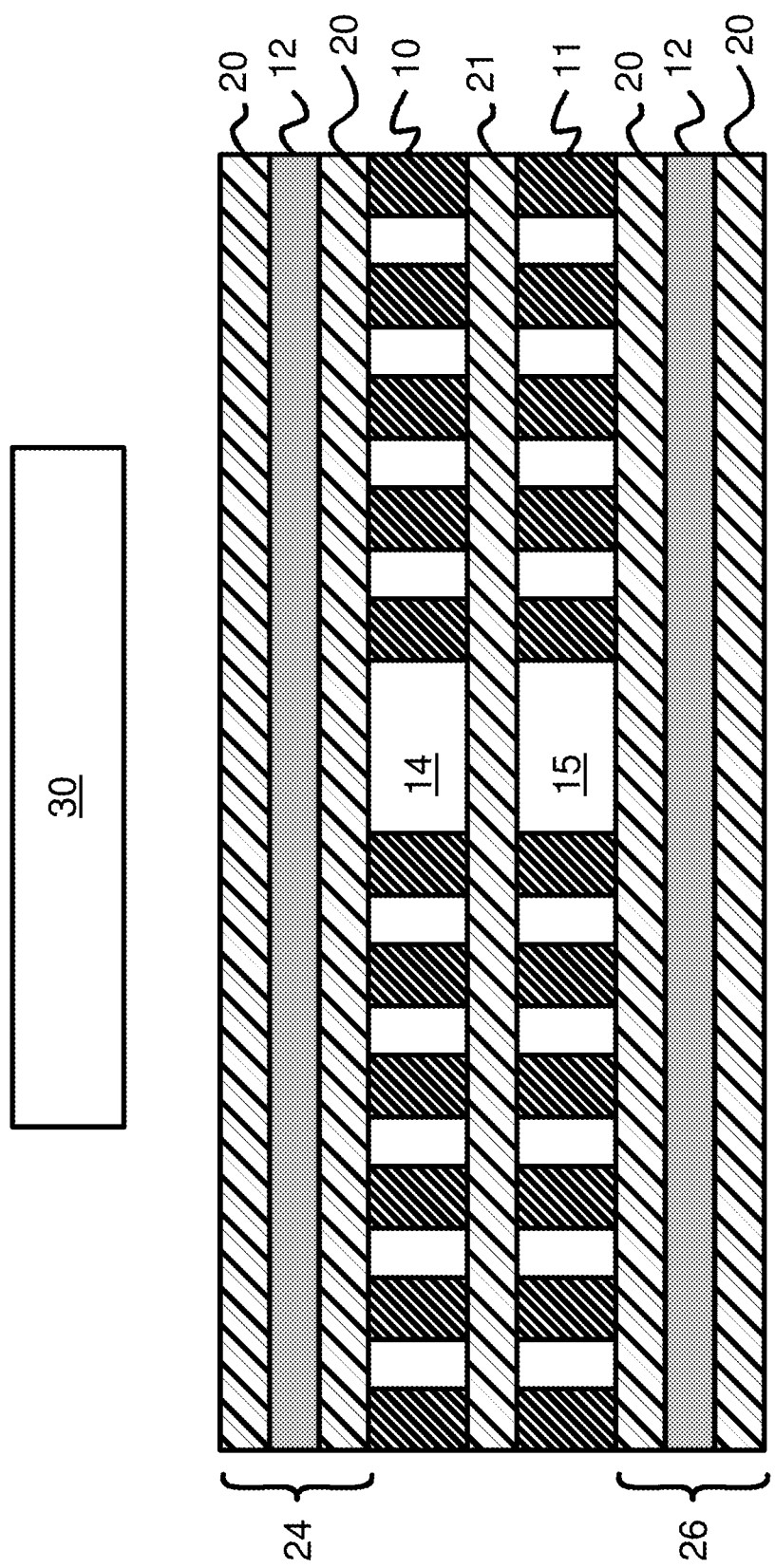
FIG. 1 is a simplified cross-section of a shielded-transformer semiconductor package.

FIG. 1 is a simplified cross-section of a shielded-transformer semiconductor package. Semiconductor chip 30 and transformer coils 10, 11 are integrated together in a package (not shown). Transformer coil 10 has air core 14 at its center and has spirals out of the plane of FIG. 1. Although this cross-section shows breaks in transformer coil 10, transformer coil 10 is actually one continuous coil perpendicular to the plane of FIG. 1.

Upper transformer coil 10 can be the primary windings while lower transformer coil 11 can be the secondary windings of the transformer, wherein current flow through primary transformer coil 10 generates the magnetic field that induces a current in secondary transformer coil 11. Transformer coils 10, 11 are separated from each other by dielectric laminate layer 21.

Upper ferrite-dielectric shield 24 shields the top of transformer coil 10, while lower ferrite-dielectric shield 26 shields the bottom of transformer coil 11. Air core 14 in the center of transformer coil 10 is aligned with air core 15 in the center of transformer coil 11. Semiconductor chip 30 can be placed either above upper ferrite-dielectric shield 24 or below lower ferrite-dielectric shield 26.

When primary current is passed through transformer coil 10, an Electro-Magnetic field is generated which could cause Electro-Magnetic Interference (EMI) in semiconductor chip 30. However, upper ferrite-dielectric shield 24 is placed over transformer coil 10, between transformer coil 10 and semiconductor chip 30. Upper ferrite-dielectric shield 24 contains ferrite layer 12 that is sandwiched by dielectric laminate layers 20 on its top and bottom.

Ferrite layer 12 is a ceramic layer that contains magnetized iron or ferrite metal particles, such as Manganese-zinc ferrite (MnZn, with the formula $Mn_aZn_{(1-a)}Fe_2O_4$), or Nickel-zinc ferrite (NiZn, with the formula $Ni_aZn_{(1-a)}Fe_2O_4$. Dielectric laminate layers 20 can be a plastic laminate or other insulator, such as FR4 or PI, which are NEMA grade designations for glass-reinforced epoxy laminate material. FR-4 is a composite material composed of woven fiberglass cloth with an epoxy resin binder that is flame resistant (self-extinguishing). PI is a polyimide, which is a polymer of imide monomers belonging to the class of high performance plastics. A classic polyimide is Kapton, which is produced by condensation of pyromellitic dianhydride and 4,4'-oxydianiline. Upper ferrite-dielectric shield 24 can be made as sheets of ferrite layer 12 covered on the top and bottom by dielectric laminate layers 20 that can be cut to size as needed.

A second shield is provided by lower ferrite-dielectric shield 26 to prevent EMF from escaping from the bottom of transformer coils 10, 11 and possibly looping around the edges of upper ferrite-dielectric shield 24 to reach semiconductor chip 30. Since transformer coils 10, 11 are sandwiched by upper ferrite-dielectric shield 24 and lower ferrite-dielectric shield 26, the electro-magnetic field generated by transformer coil 10 is limited to a small region between ferrite layers 12 in upper ferrite-dielectric shield 24 and lower ferrite-dielectric shield 26.

This limiting of the electro-magnetic field by ferrite layers 12 also increases the inductance of transformer coils 10, 11. Even through transformer coil 10 is an air-core transformer since the center of transformer coil 10 is air core 14, the presence of ferrite layer 12 above and below the plane of transformer coil 10 acts to increase its inductance.

Upper ferrite-dielectric shield 24 can touch the top of transformer coil 10 since dielectric laminate layers 20 prevents electrical shorting between transformer coil 10 and ferrite layer 12. Thus ferrite layers 12 may be placed very close to transformer coil 10. The thickness of dielectric laminate layers 20 may be only 0.1 mm, so the electromagnetic field can be very tightly restricted. This tight spacing and restriction of the electromagnetic field can further intensify the inductance of transformer coils 10, 11.

Although being an air-core transformer, transformer coils 10, 11 surrounded by ferrite-dielectric shields 24, 26 can have a respectable inductance value approaching that of a magnetic-core transformer.

Figure 2A:
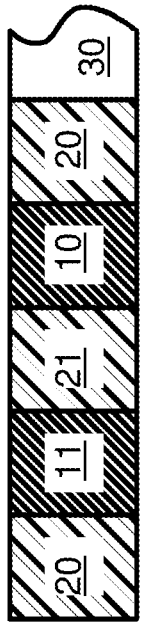
FIGS. 2A, 2B, 2C show a graph of electromagnetic field strength across the cross-section of the shielded-transformer semiconductor package of FIG. 1.
Figure 2B:
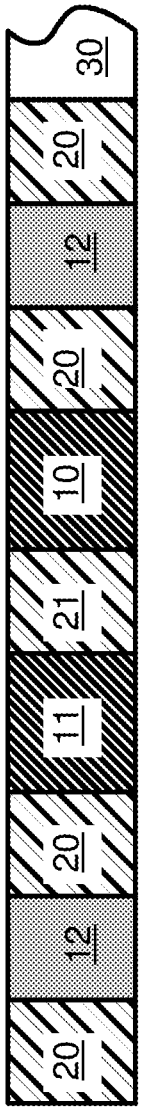
Figure 2C:
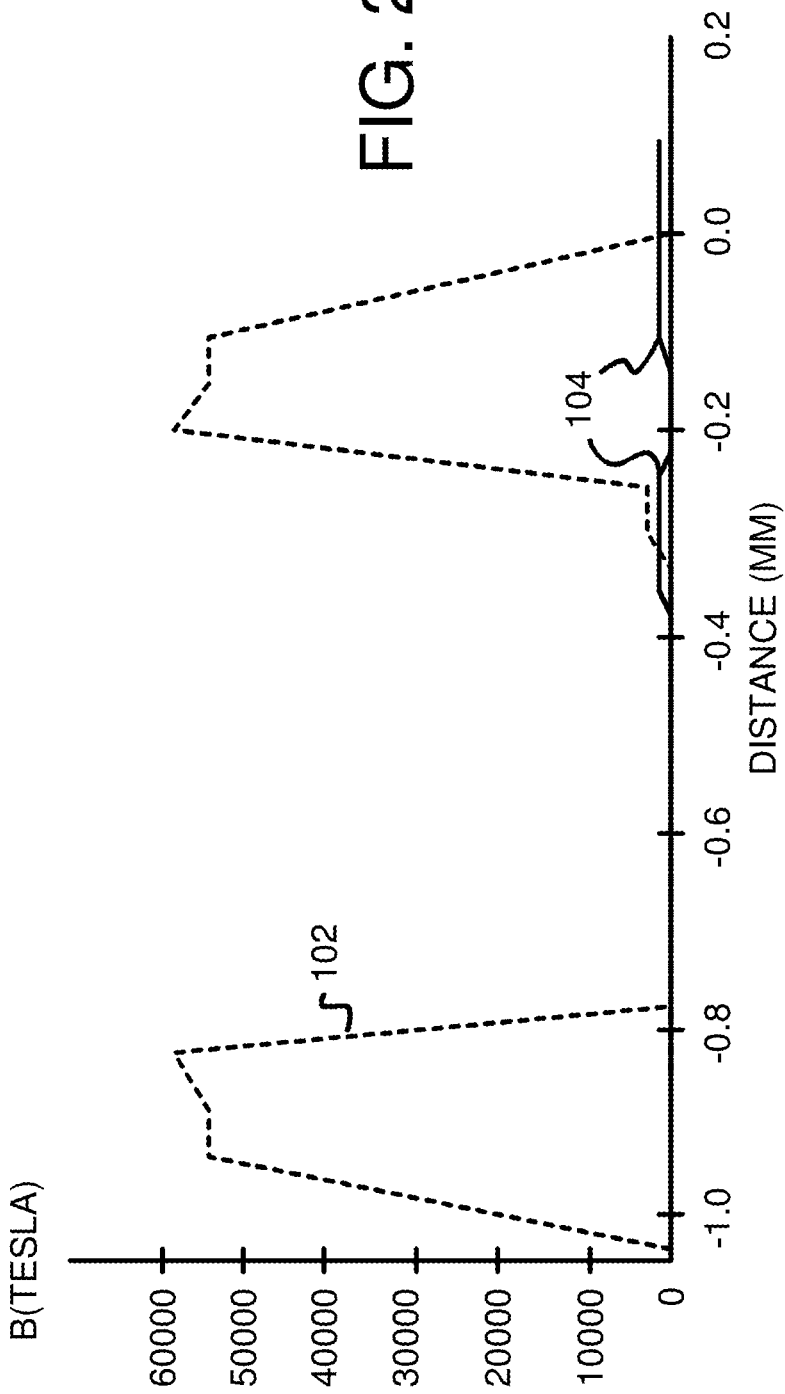

FIGS. 2A, 2B, 2C show a graph of electromagnetic field strength across the cross-section of the shielded-transformer semiconductor package of FIG. 1. When an alternating current is passed through transformer coil 10, a time-varying electromagnetic field is generated that induces a current in secondary transformer coil 11. When ferrite layer 12 is not present, as in FIG. 2A, the strength of this electromagnetic field is as shown by curve 104 in FIG. 2C.

The presence of ferrite layer 12 in FIG. 2B causes the electromagnetic field to be concentrated within ferrite layer 12, and to drop rapidly within dielectric laminate layers 20 that surround each ferrite layer 12. Curve 102 in FIG. 2C shows that the drop-off in electromagnetic field strength is so rapid that the electromagnetic field is close to zero outside of dielectric laminate layers 20 and ferrite layer 12 that are each 0.1 mm in thickness. Near semiconductor chip 30, the electromagnetic field with ferrite layer 12, shown by curve 102, is much smaller than the electromagnetic field without ferrite layer 12, shown by curve 104.

While the spikes of the electromagnetic field within ferrite layer 12 are large, as shown by curve 102, these spikes provide lower electromagnetic field strength outside of dielectric laminate layers 20, such as near the surface of semiconductor chip 30. Thus EMI is reduced at chip semiconductor chip 30 due to ferrite layer 12.

Ferrite layer 12 may decrease the electromagnetic field seen by semiconductor chip 30 by roughly a factor of 2,000.

Figure 3:
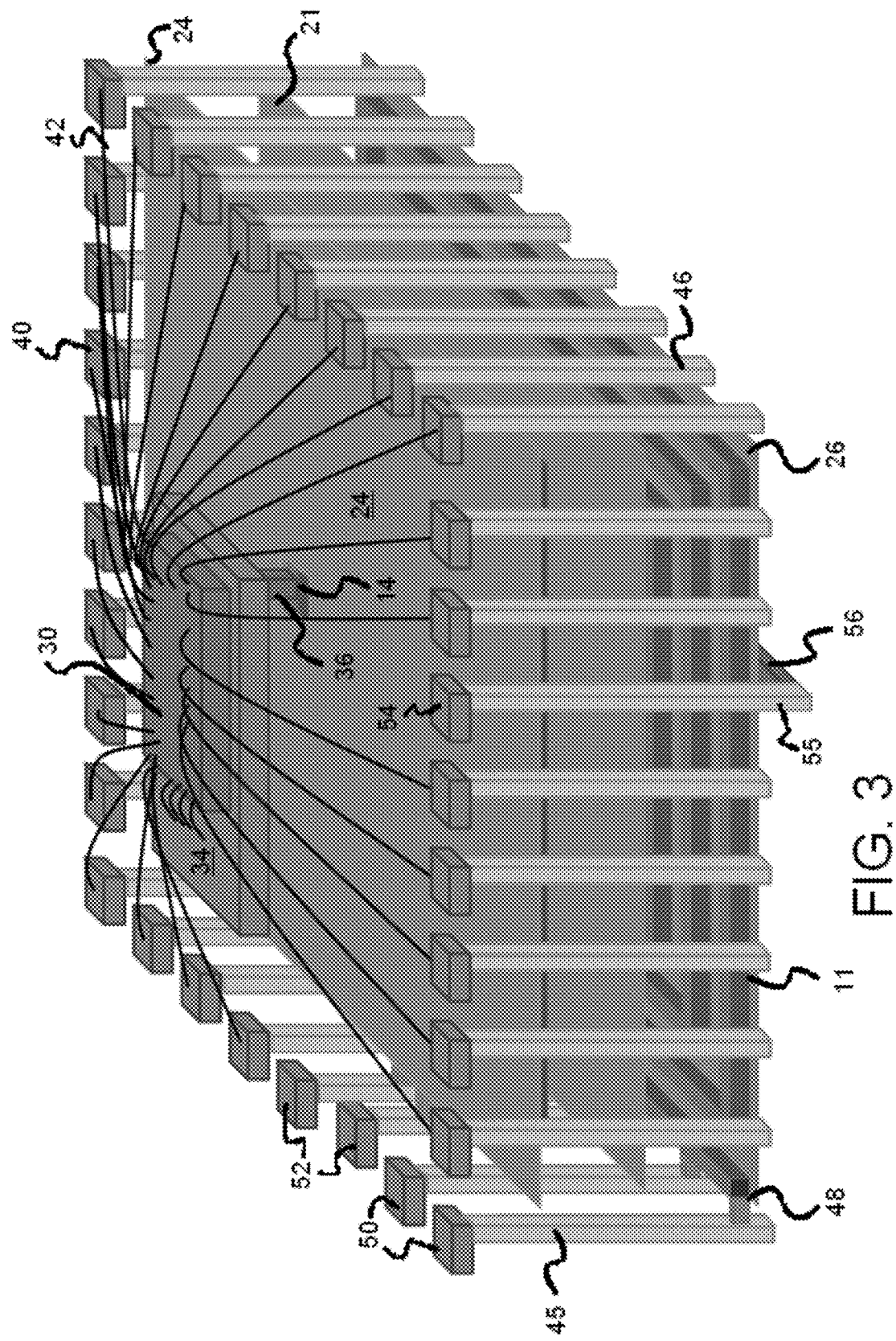
FIG. 3 is a 3D diagram of a shielded-transformer semiconductor package.

FIG. 3 is a 3D diagram of a shielded-transformer semiconductor package. Semiconductor chip 30 is attached to die attach pad 34 such as by epoxy or other bonding. Bonding wires 42 are routed between bonding pads on semiconductor chip 30 and lead-frame pads 40. A few bonding wires are routed from bonding pads on semiconductor chip 30 to die attach pad 34. An opening in upper ferrite-dielectric shield 24 over air core 14 allows center post 36 to pass through.

Lead-frame pads 40, 50, 52, 54 sit atop lead-frame risers 46, 45, 55 that can connect to package pins that protrude out the bottom of the package and can fit in holes in a PCB when being soldered to the PCB of the larger system. Lead-frame risers 46, 45, 55 may be bent or connect to other parts of the lead frame (not shown) that lead to the external package pins, bonding balls, or other external connectors (not shown).

Lead-frame risers 46, 45, 55 form a rectangle that surrounds semiconductor chip 30, die attach pad 34, and transformer coils 10, 11, which are mostly hidden from view by upper ferrite-dielectric shield 24. Transformer coil 10 is covered on the top by upper ferrite-dielectric shield 24 while transformer coil 11 is covered on the bottom by lower ferrite-dielectric shield 26. Depending on the inductance value desired, the area of transformer coils 10, 11 can be larger than that of die attach pad 34 and semiconductor chip 30.

Figure 4:
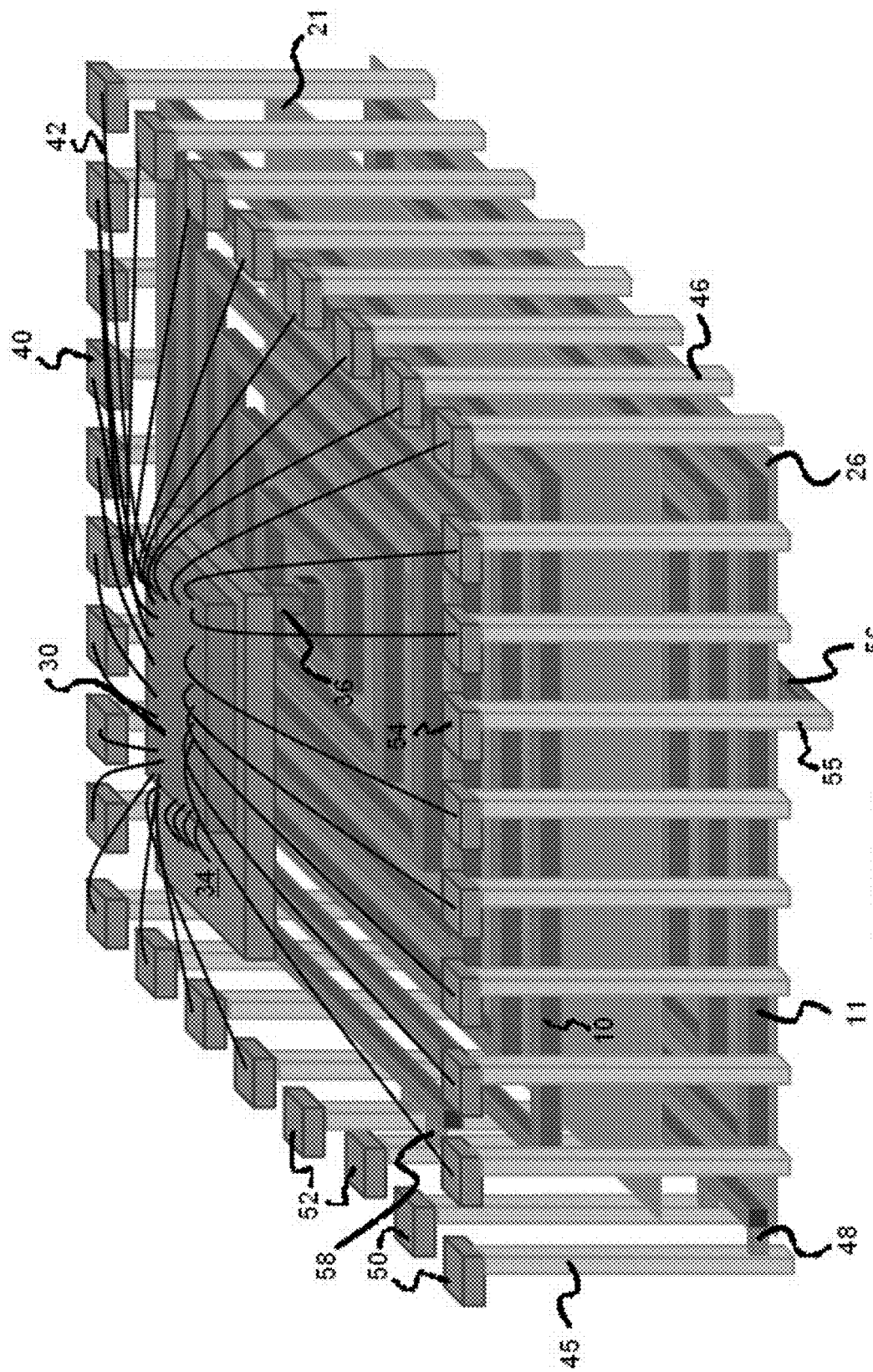
FIG. 4 is a 3D diagram of a shielded-transformer semiconductor package with the upper ferrite-dielectric shield removed to show the transformer coil.

FIG. 4 is a 3D diagram of a shielded-transformer semiconductor package with the upper ferrite-dielectric shield removed to show the transformer coil. In FIG. 4, upper ferrite-dielectric shield 24 has been removed from view. Upper transformer coil 10 is a planar coil that coils outward from center post 36 at its center, which electrically connects die attach pad 34 to the center winding of transformer coil 10. The outer-most winding of upper transformer coil 10 connects to lead-frame risers 46 under lead-frame pads 52 through coil extensions 58.

Transformer coils 10, 11 are separated from each other by dielectric laminate layer 21. Lower transformer coil 11 is a planar coil that coils outward from lower center post 56 at its center that extends outward, under lower transformer coil 11, to lead-frame riser 55, which electrically connects to lead-frame pad 54. The outer-most winding of lower transformer coil 11 connects to lead-frame risers 45 under lead-frame pads 50 through coil extensions 48.

Most bonding pads on semiconductor chip 30 make electrical connection to package pins at the end of lead-frame risers 45, 46, 55 through bonding wires 42 and lead-frame pads 40, 50, 52, 54. However, several bonding pads of semiconductor chip 30 have bonding wires that connect to the top surface of die attach pad 34. Electrical connection is then made from the top surface of die attach pad 34 to the bottom surface of die attach pad 34 and to center post 36. Die attach pad 34 could be conductive or metal traces and vias or through-holes in die attach pad 34 could make the electrical connection from semiconductor chip 30 to center post 36. Electrical connection is thus made from semiconductor chip 30 to the central winding of upper transformer coil 10.

The outer winding of upper transformer coil 10 connects through coil extension 58 to lead-frame risers 46 which have lead-frame pads 52 on top and connect on the bottom to external package pins. Lead-frame pads 52 do not receive a bonding wire 42 from semiconductor chip 30.

The outer winding of lower transformer coil 11 connects through coil extensions 48 to lead-frame outer risers 45 which have lead-frame pads 50 on top and connect on the bottom to external package pins. Lead-frame pads 50 do not receive a bonding wire 42 from semiconductor chip 30.

Thus a series inductance is provided by transformer coil 10 between several bonding pads of semiconductor chip 30 and the external package pins. When a varying current flows through upper transformer coil 10, the electromagnetic field generated is shielded from causing EMI in semiconductor chip 30 by upper ferrite-dielectric shield 24 (FIG. 3). This electromagnetic field generated by upper transformer coil 10, acting as the primary coil, induces current flow in lower transformer coil 11, which acts as the secondary coil of the transformer.

Figure 5:
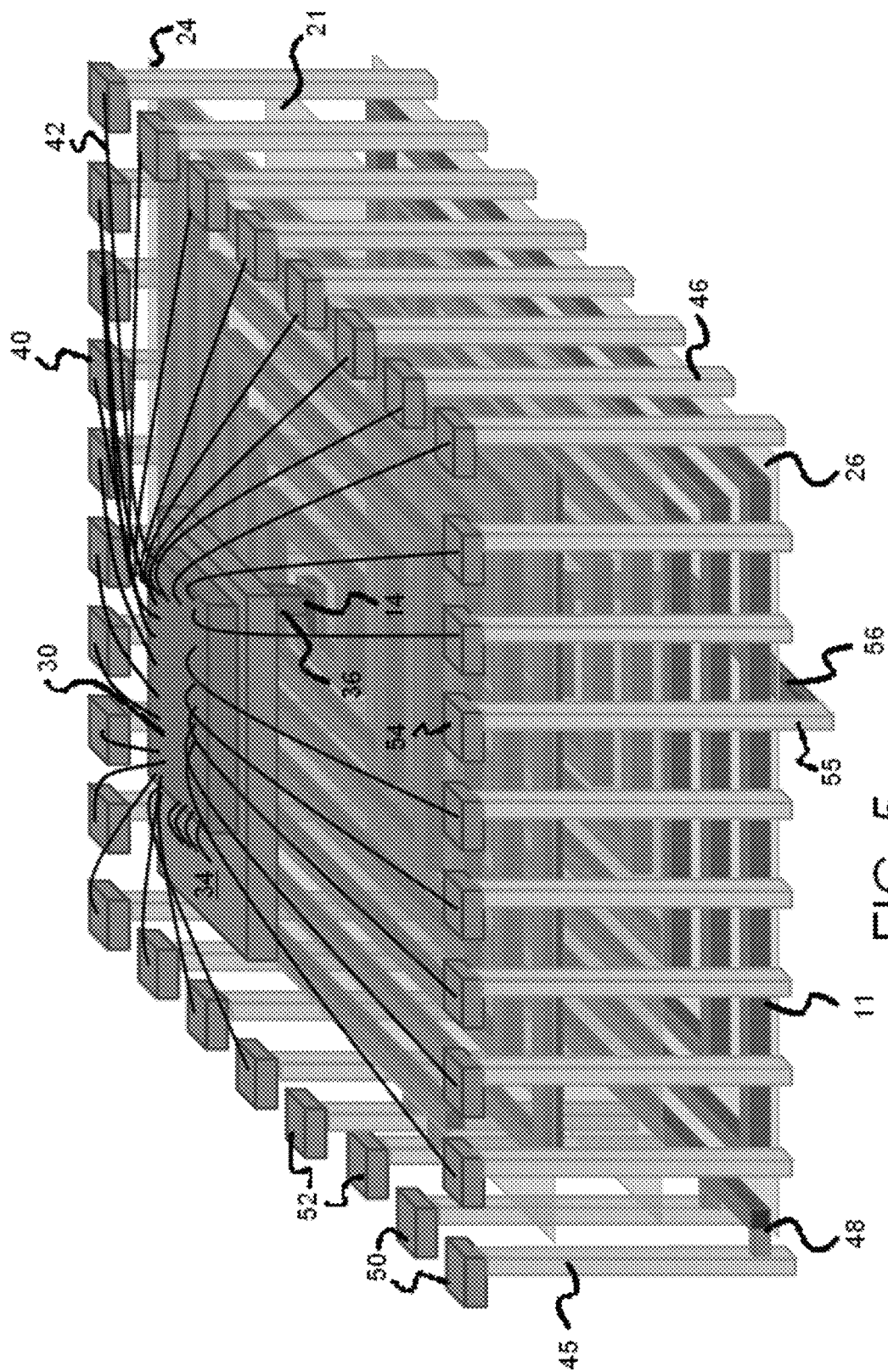
FIG. 5 is a 3D diagram of a shielded-transformer semiconductor package with the upper ferrite-dielectric shield and the middle dielectric laminate layer made transparent to show the upper and lower transformer coils.

FIG. 5 is a 3D diagram of a shielded-transformer semiconductor package with the upper ferrite-dielectric shield and the middle dielectric laminate layer made transparent to show the upper and lower transformer coils. In FIG. 5, upper ferrite-dielectric shield 24 and middle dielectric laminate layer 21 are made transparent to better show lower transformer coil 11.

When a varying current flows through upper transformer coil 10, the electromagnetic field generated by upper transformer coil 10, acting as the primary coil, induces current flow in lower transformer coil 11, which acts as the secondary coil of the transformer.

Lower transformer coil 11 is a planar coil that coils outward from lower center post 56 at its center that extends outward, under lower transformer coil 11, to lead-frame riser 55, which electrically connects to lead-frame pad 54. The outer-most winding of lower transformer coil 11 connects to lead-frame risers 45 under lead-frame pads 50 through coil extensions 48. The induced secondary current flows between lead-frame pads 50, 54.

Figure 6:
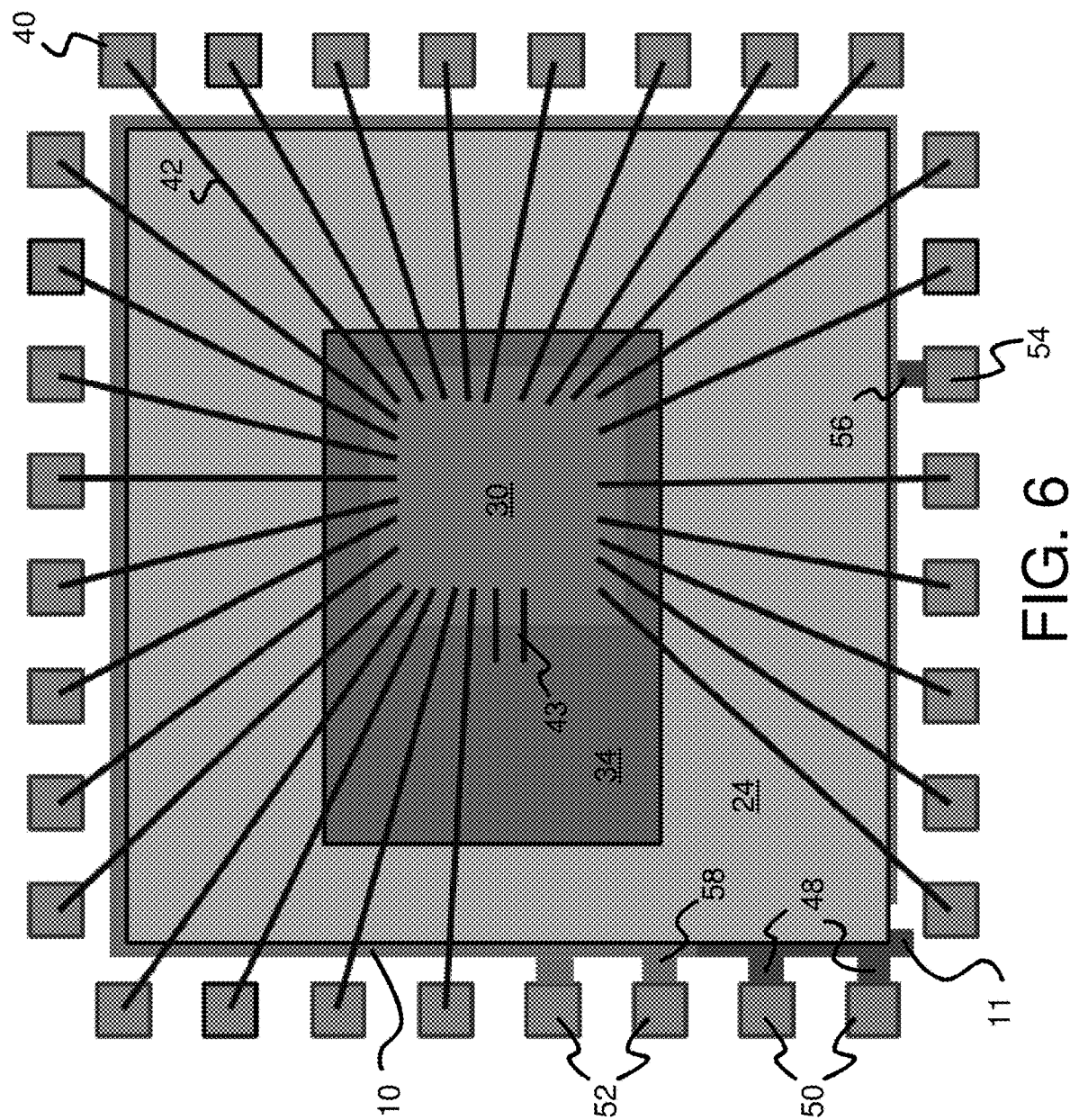
FIG. 6 is a top view of the shielded-transformer semiconductor package of FIGS. 3-5.

FIG. 6 is a top view of the shielded-transformer semiconductor package of FIGS. 3-5. Semiconductor chip 30 is attached to the top of die attach pad 34 and is electrically connected to lead-frame pads 40 by bonding wires 42. Lead-frame risers 46 are hidden by lead-frame pads 40 in this top view.

Most of transformer coils 10, 11 are hidden from view by upper ferrite-dielectric shield 24 that sits between die attach pad 34 and upper transformer coil 10 and provides an EMI shield to semiconductor chip 30. However, part of the outer winding of upper transformer coil 10 is visible. The end of the outer winding of transformer coil 10 is connected by coil extension 58 to lead-frame outer risers 46 (not shown) and then to lead-frame pads 52. The inner winding of transformer coil 10 connects to the underside of die attach pad 34 and then through bonding wires 43 to semiconductor chip 30.

Also, part of the outer winding of lower transformer coil 11 is visible. The end of the outer winding of lower transformer coil 11 is connected by coil extension 48 to lead-frame outer risers 45 (not shown) and then to lead-frame pads 50. The inner winding of lower transformer coil 11 connects to lower center post 56, under semiconductor chip 30. Lower center post 56 extends outward from the center, under lower transformer coil 11, to lead-frame riser 55 (not shown), which electrically connects to lead-frame pad 54. A small portion of lower center post 56 is visible near lead-frame pad 54 in FIG. 6.

Figure 7:
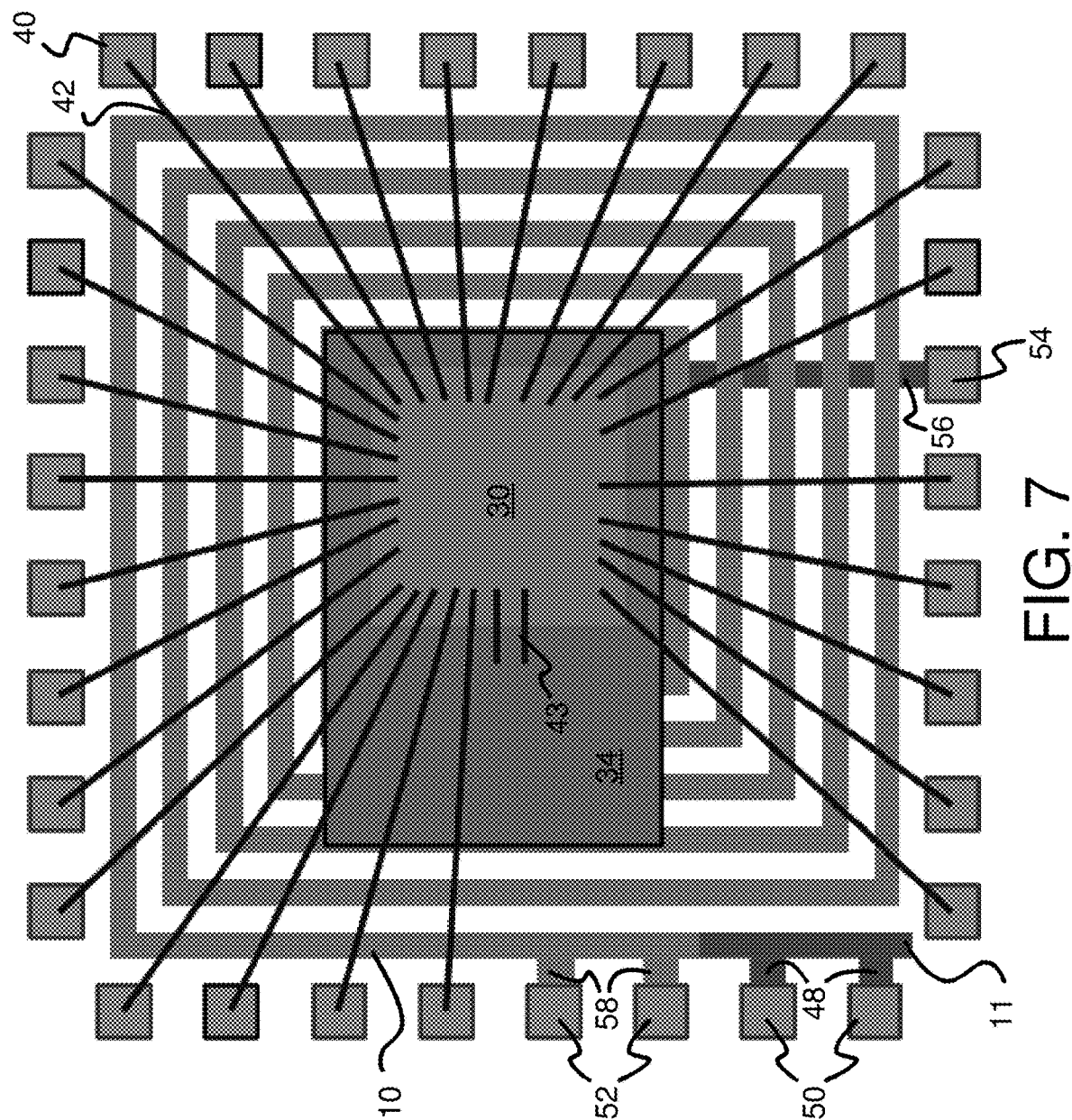
FIG. 7 is a top view of the shielded-transformer semiconductor package of FIGS. 3-5 with the top shield layer removed.

FIG. 7 is a top view of the shielded-transformer semiconductor package of FIGS. 3-5 with the upper ferrite-dielectric shield removed to show the transformer coils. Upper transformer coil 10 coils outward from its center, which is hidden by semiconductor chip 30 and die attach pad 34, to its outermost winding. The end of the outer winding of transformer coil 10 is connected by coil extension 58 to lead-frame outer risers 46 (not shown) and then to lead-frame pads 52.

Lower transformer coil 11 coils outward from its center, which is hidden by semiconductor chip 30 and die attach pad 34, to its outermost winding. The end of the outer winding of lower transformer coil 11 is connected by coil extension 48 to lead-frame outer risers 45 (not shown) and then to lead-frame pads 50. The inner winding of lower transformer coil 11 connects to lower center post 56, hidden under semiconductor chip 30. Lower center post 56 extends outward from the center, under lower transformer coil 11, to lead-frame riser 55 (not shown), which electrically connects to lead-frame pad 54. A larger portion of lower center post 56 is visible near lead-frame pad 54 in FIG. 7.

Figure 8:
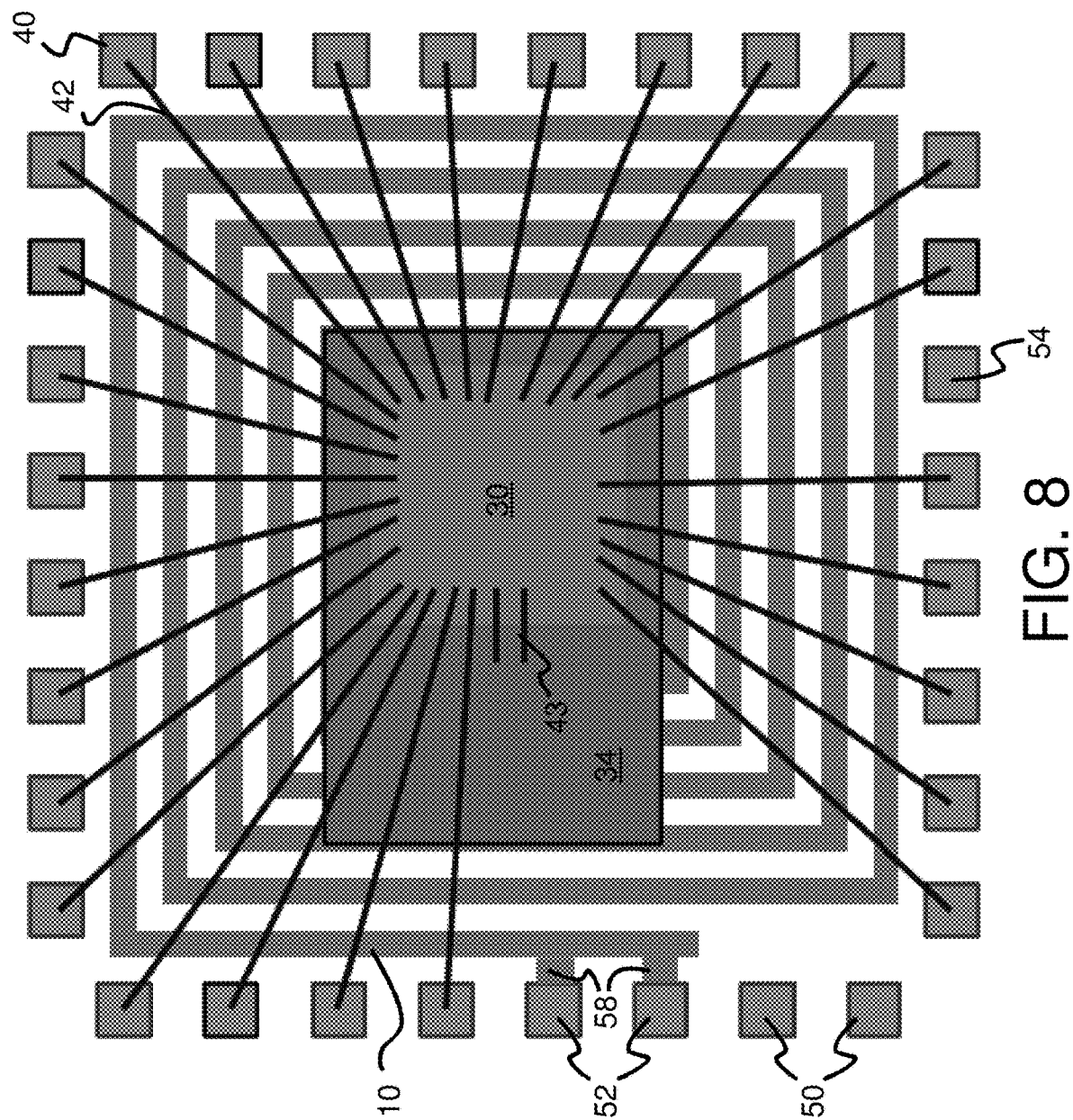
FIG. 8 is a top view of the shielded-transformer semiconductor package of FIGS. 3-5 showing the upper transformer coil.

FIG. 8 is a top view of the shielded-transformer semiconductor package of FIGS. 3-5 with some layers removed to show the upper transformer coil. Upper transformer coil 10 coils outward from its center, which is hidden by semiconductor chip 30 and die attach pad 34, to its outermost winding. The end of the outer winding of transformer coil 10 is connected by coil extension 58 to lead-frame outer risers 46 (not shown) and then to lead-frame pads 52. Lower transformer coil 11 has been removed from FIG. 8.

Figure 9:
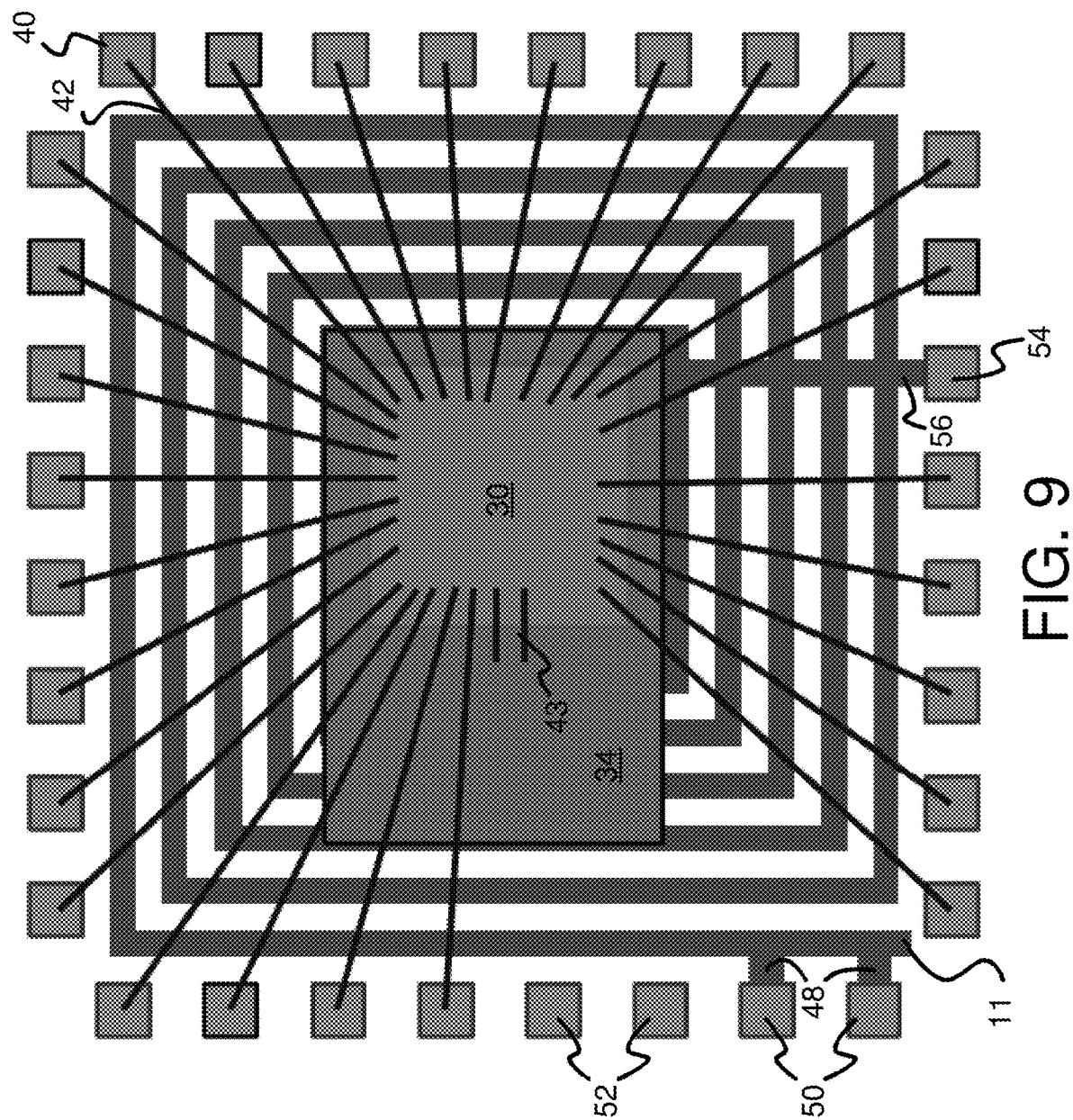
FIG. 9 is a top view of the shielded-transformer semiconductor package of FIGS. 3-5 showing the lower transformer coil.

FIG. 9 is a top view of the shielded-transformer semiconductor package of FIGS. 3-5 with some layers removed to show the lower transformer coil. Upper transformer coil 10 has been removed from FIG. 9.

Lower transformer coil 11 coils outward from its center, which is hidden by semiconductor chip 30 and die attach pad 34, to its outermost winding. The end of the outer winding of lower transformer coil 11 is connected by coil extension 48 to lead-frame outer risers 45 (not shown) and then to lead-frame pads 50. The inner winding of lower transformer coil 11 connects to lower center post 56, hidden under semiconductor chip 30. Lower center post 56 extends outward from the center, under lower transformer coil 11, to lead-frame riser 55 (not shown), which electrically connects to lead-frame pad 54. All but the enter portion of lower center post 56 is visible in FIG. 9. Note that lower center post 56 is on a lower plane than the plane of lower transformer coil 11 so the intersections shown are not electrical connections between lower transformer coil 11 and lower center post 56.

Figure 10:
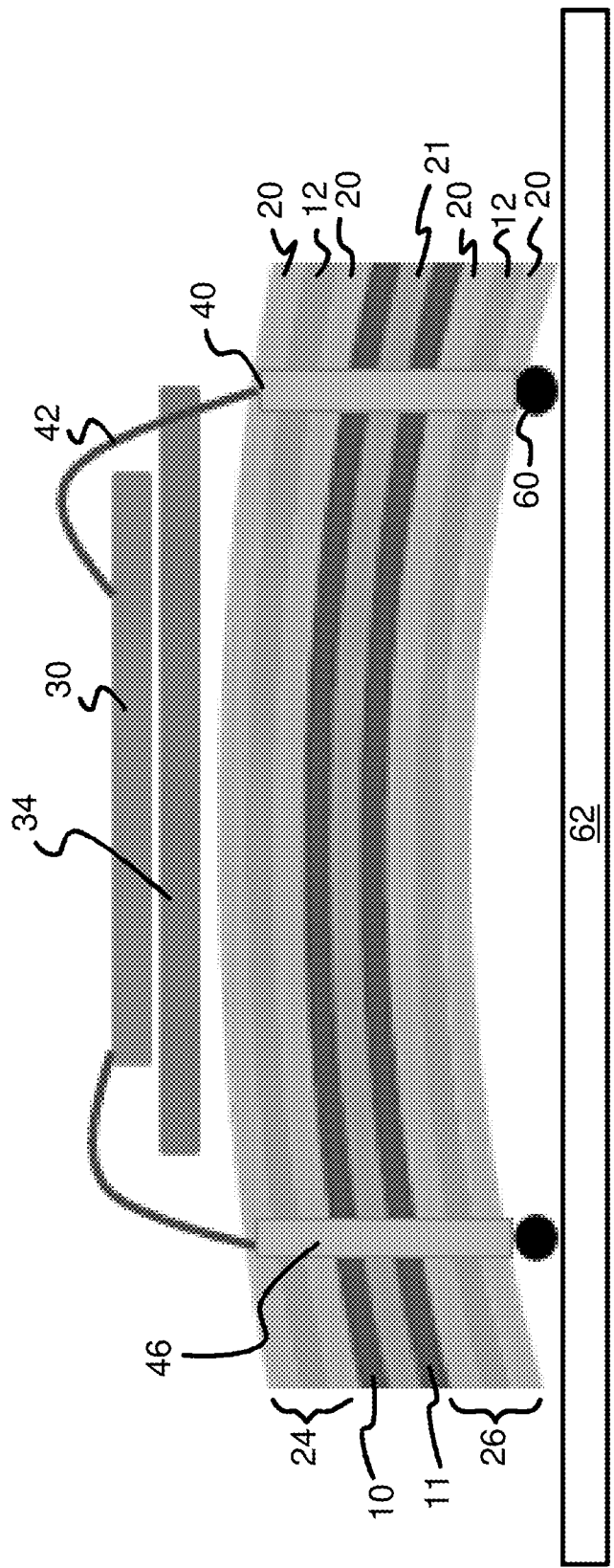
FIG. 10 is a cross-section of the shielded-transformer semiconductor package mounted to a PCB using surface-mount bonding balls.

FIG. 10 is a cross-section of the shielded-transformer semiconductor package mounted to a PCB using surface-mount bonding balls. Upper transformer coil 10 is sandwiched between upper ferrite-dielectric shield 24 and dielectric laminate layer 21, while lower transformer coil 11 is sandwiched between dielectric laminate layer 21 and lower ferrite-dielectric shield 26. These layers form a flexible laminate that can be bent.

The coils within transformer coil 10 can move up or down relative to the plane since transformer coil 10 is not a continuous sheet of metal but is formed into a coil of metal windings. Likewise, the coils within lower transformer coil 11 can move up or down relative to the plane since lower transformer coil 11 is not a continuous sheet of metal but is formed into a coil of metal windings.

Upper ferrite-dielectric shield 24 and lower ferrite-dielectric shield 26 each contain ferrite layer 12 surrounded by dielectric laminate layers 20. Dielectric laminate layers 20 prevent shorting of ferrite layer 12 to transformer coils 10, 11. FIG. 10 shows a maximum flex or curvature of transformer coils 10, 11.

Semiconductor chip 30 on die attach pad 34 is connected to lead-frame pads 40 at the tops of lead-frame risers 46 by bonding wires 42. The tops of lead-frame risers 46 can function as lead-frame pads 40 in this embodiment. Semiconductor chip 30 is mounted to die attach pad 34 which sits over the top of upper ferrite-dielectric shield 24. Ferrite layer 12 blocks magnetic flux generated by transformer coils 10, 11 from reaching semiconductor chip 30 and causing EMI.

The bottom of lead-frame risers 46 have bonding balls 60 attached, which can be solder balls that form a solder bond to surface-mount pads on PCB 62 when heated. Plastic encapsulant (not shown) can encapsulate semiconductor chip 30 and protect bonding wires 42.

Figure 11:
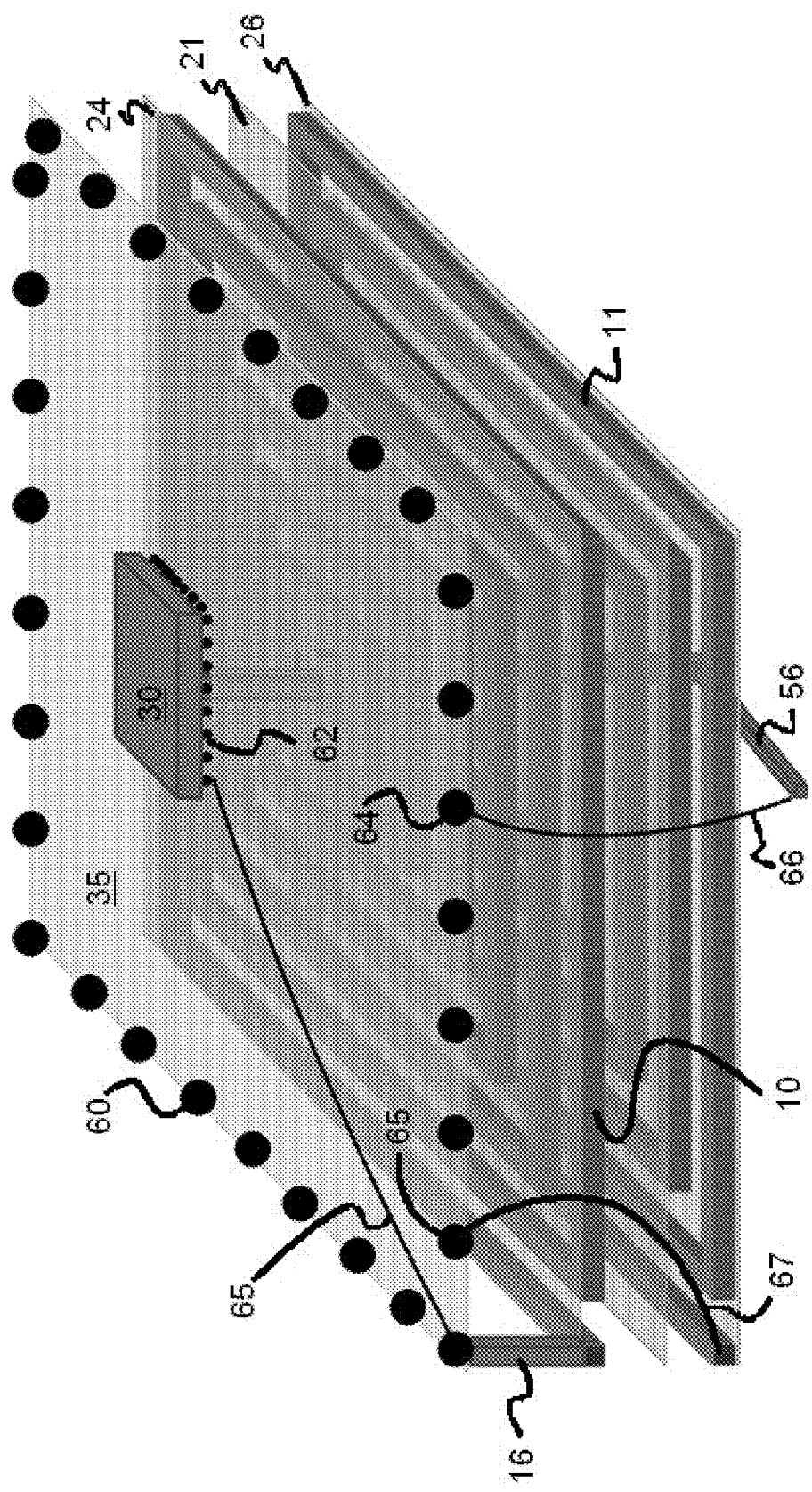
FIG. 11 is an alternative flip-chip shielded-transformer semiconductor package with bonding balls.

FIG. 11 is an alternative flip-chip shielded-transformer semiconductor package with bonding balls. Semiconductor chip 30 is a surface-mount die that is flipped and attached to the top of package substrate 35 by bonding balls 62. Metal traces patterned on package substrate 35 connect chip bonding balls 62 to larger external bonding balls 60 that connect the shielded-transformer semiconductor package to a system PCB.

Upper transformer coil 10 and lower transformer coil 11 are separated by dielectric laminate layer 21. Upper ferrite-dielectric shield 24 shields the top of upper transformer coil 10, while lower ferrite-dielectric shield 26 shields the bottom of lower transformer coil 11. The air core at the center of upper transformer coil 10 is aligned with the air core in the center of lower transformer coil 11. Coil riser 16 connects the outer winding of upper transformer coil 10 to package substrate 35 and then to bonding balls 60 or to semiconductor chip 30. Bonding wire 65 can be added to connect one of chip bonding balls 62 on semiconductor chip 30 to bonding ball 60 that connects to coil riser 16 at the outer end of transformer coil 10.

The center winding of lower transformer coil 11 connects to lower center post 56 and then to bonding wire 66 that connects to bonding ball 64 on package substrate 35. The outer winding of lower transformer coil 11 can connect in a similar manner using another bonding wire 67 that connects to another one of bonding balls 65 on package substrate 35.

Figure 12:
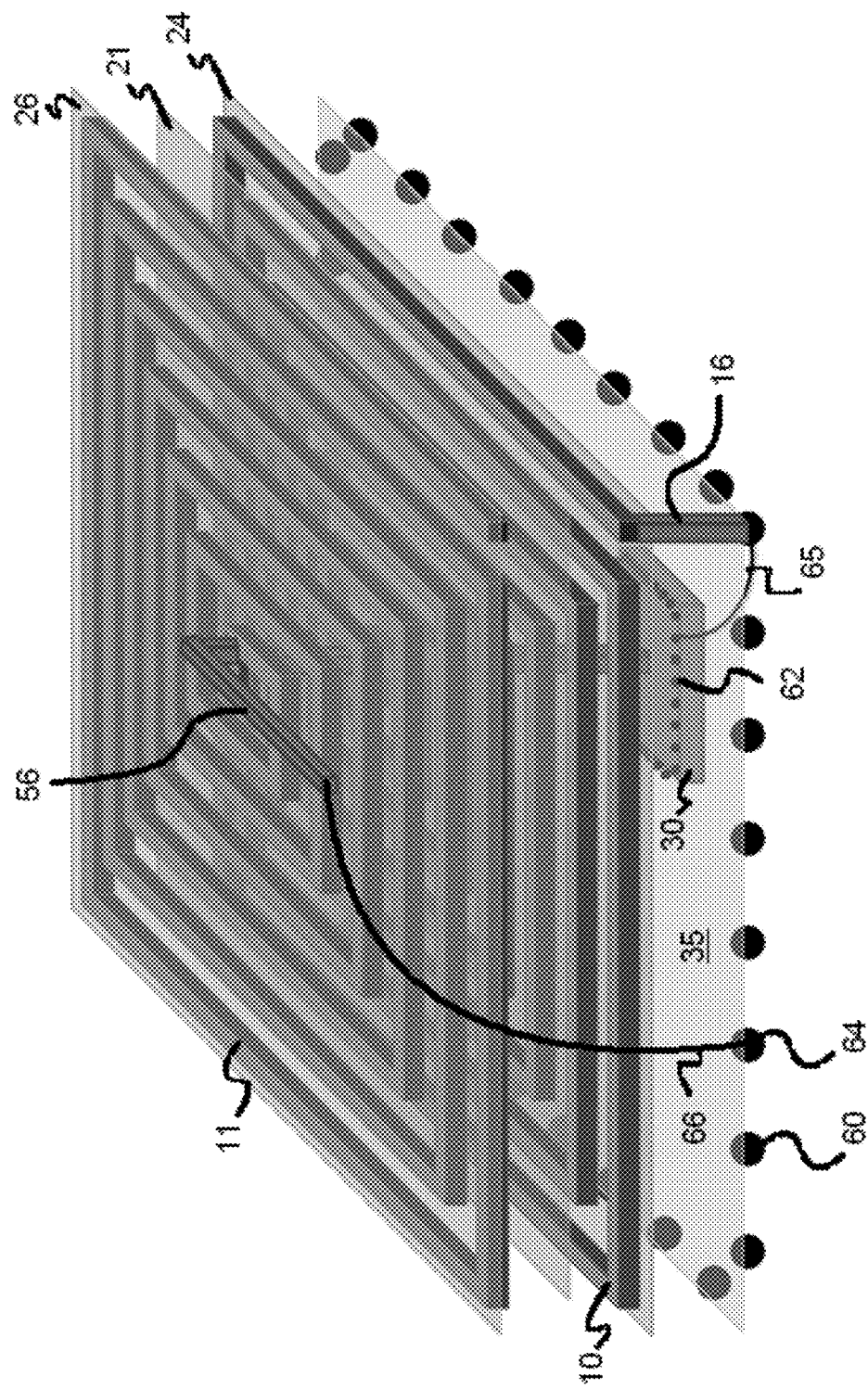
FIG. 12 shows the bottom of the alternative flip-chip shielded-transformer semiconductor package with bonding balls of FIG. 11.

FIG. 12 shows the bottom of the alternative flip-chip shielded-transformer semiconductor package with bonding balls of FIG. 11. In this bottom view, lower transformer coil 11 is visible, with lower center post 56 connecting to the center winding of lower transformer coil 11. Bonding wire 66 connects from the outer end of lower center post 56 to package substrate 35 and then to bonding ball 64.

Semiconductor chip 30 is a surface-mount die that is flipped and attached to the top of package substrate 35 by bonding balls 62. Metal traces patterned on package substrate 35 connect chip bonding balls 62 to larger external bonding balls 60 that connect the shielded-transformer semiconductor package to a system PCB.

Coil riser 16 connects the outer winding of upper transformer coil 10 to package substrate 35 and then traces on package substrate 35 can connect to bonding balls 60 or to semiconductor chip 30. Bonding wire 65 can be added to connect one of chip bonding balls 62 on semiconductor chip 30 to bonding ball 60 that connects to coil riser 16 at the outer end of transformer coil 10.

Figure 13:
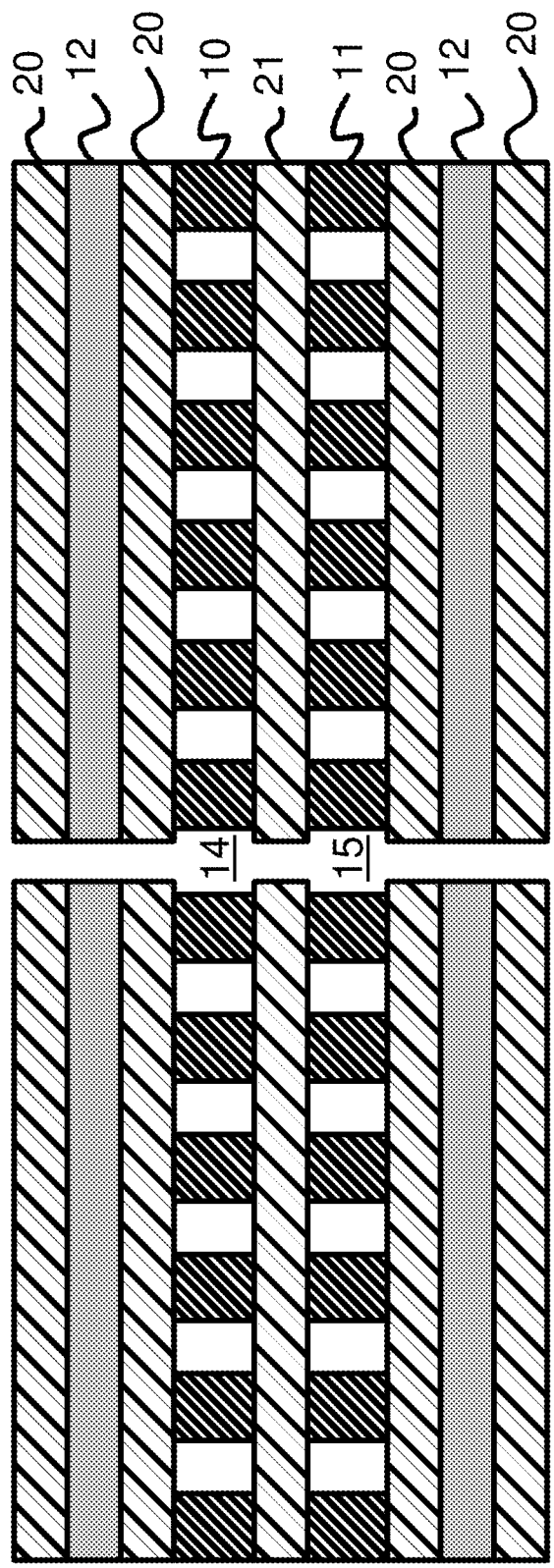
FIG. 13 is a cross section of an alternative shielded-transformer semiconductor package with two coils.

FIG. 13 is a cross section of an alternative shielded-transformer semiconductor package with two coils. Two transformer coils 10, 11 are separated by dielectric laminate layers 21. In this variation, air core 14 and air core 15 are connected together by a larger hole that extends through ferrite layers 12 and dielectric laminate layers 20, 21. Although there is an opening in ferrite layer 12 that magnetic flux might leak out of and cause EMI in semiconductor chip 30, this opening is relatively small and is in the middle of the coils so leakage is small. The larger hole provides more space for connecting the coils 10, 11. The central opening allows center post 36 to fit through ferrite layer 12 and dielectric laminate layers 20 between semiconductor chip 30 and transformer coil 10.

Figure 14:
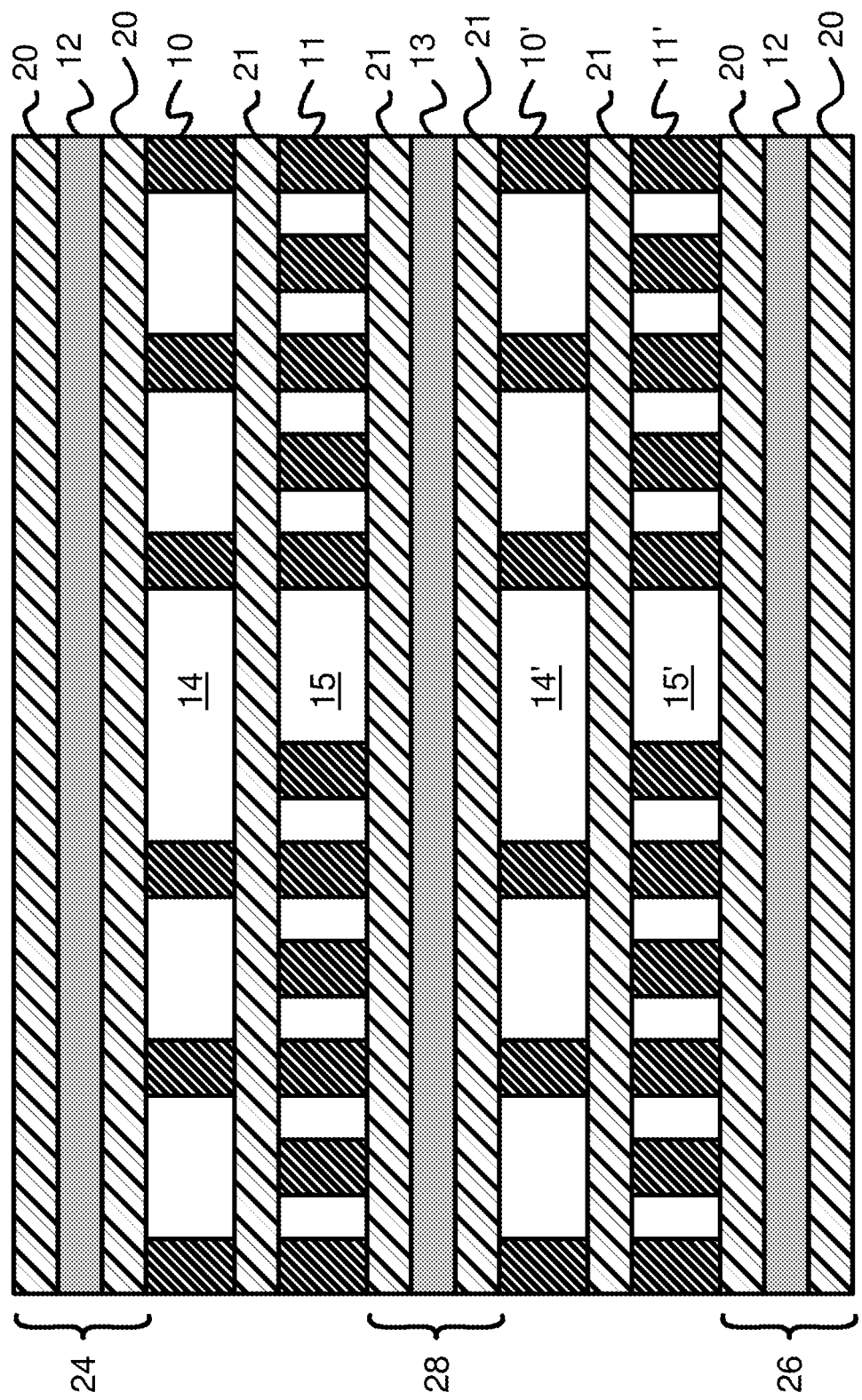
FIG. 14 is a cross section of an alternative shielded-transformer semiconductor package with four coils.

FIG. 14 is a cross section of an alternative shielded-transformer semiconductor package with four coils. Upper transformer coils 10, 10' have fewer windings than lower transformer coils 11, 11'. When primary current is applied to upper transformer coils 10, 10', a voltage is induced by mutual inductance in lower transformer coils 11, 11', which act as the secondary.

Upper transformer coils 10, 10' could be connected in series, with the center of upper transformer coil 10 connected through center post 36 to semiconductor chip 30, and the outer winding of upper transformer coil 10 connected to the inner winding of upper transformer coil 10', such as by additional posts similar to lower center post 56. The outer winding of upper transformer coil 10' then connects through coil extension 58 and lead-frame risers 46 to lead-frame pads 52.

Alternatively, upper transformer coils 10, 10' could be connected in parallel, with the centers of both upper transformer coils 10, 10' connected through center post 36 to semiconductor chip 30, and the outer windings of both upper transformer coils 10, 10' connected through coil extension 58 and lead-frame risers 46 to lead-frame pads 52.

A series connection of coils provides more windings and inductance, but with a higher coil resistance. A parallel connection of coils provides fewer windings and less inductance, but with a lower coil resistance.

Likewise, lower transformer coils 11, 11' could be connected in series, with the center of lower transformer coil 11 connected through lower center post 56 and lead-frame riser 55 to lead-frame pad 54, and the outer winding of lower transformer coil 11 connected to the inner winding of lower transformer coil 11', such as by additional posts similar to lower center post 56. The outer winding of lower transformer coil 11' then connects through coil extension 48 and lead-frame risers 45 to lead-frame pads 50. The induced secondary current flows between lead-frame pads 50, 54.

Alternatively, lower transformer coils 11, 11' could be connected in parallel, with the centers of both upper transformer coils 11, 11' connected through lower center post 56 and lead-frame riser 55 to lead-frame pad 54. The outer windings of both lower transformer coils 11, 11' connect coil extension 48 and lead-frame risers 45 to lead-frame pads 50. The induced secondary current flows between lead-frame pads 50, 54.

The change in voltage from primary to secondary depends especially on the ratio of the number of turns in series of upper transformer coils 10, 10' to the number of turns in series of lower transformer coils 11, 11'. By varying the number of turns per planar coil layer, and the number of layers of planar coils, different voltage ratios can be achieved.

Upper transformer coil 10 and lower transformer coil 11 are paired together, separated by dielectric laminate layer 21, but their mutual inductance is increased by upper ferrite-dielectric shield 24 and middle ferrite-dielectric shield 28. Likewise, upper transformer coil 10' and lower transformer coil 11' are paired together, separated by another dielectric laminate layer 21, and their mutual inductance is increased by lower ferrite-dielectric shield 26 and middle ferrite-dielectric shield 28 that surround the coil pair. Middle ferrite-dielectric shield 28 contains ferrite layer 13 surrounded by two dielectric laminate layers 21.

Air cores 14, 14' and air cores 15, 15' are aligned, and can be connected together by a larger hole (not shown, see FIG. 13) that extends through ferrite layers 12, 13 and dielectric laminate layers 20, 21. The central opening allows center post 36 and lower center post 56 to fit through ferrite layers 12, 13 and dielectric laminate layers 20, 21.

Figure 15:
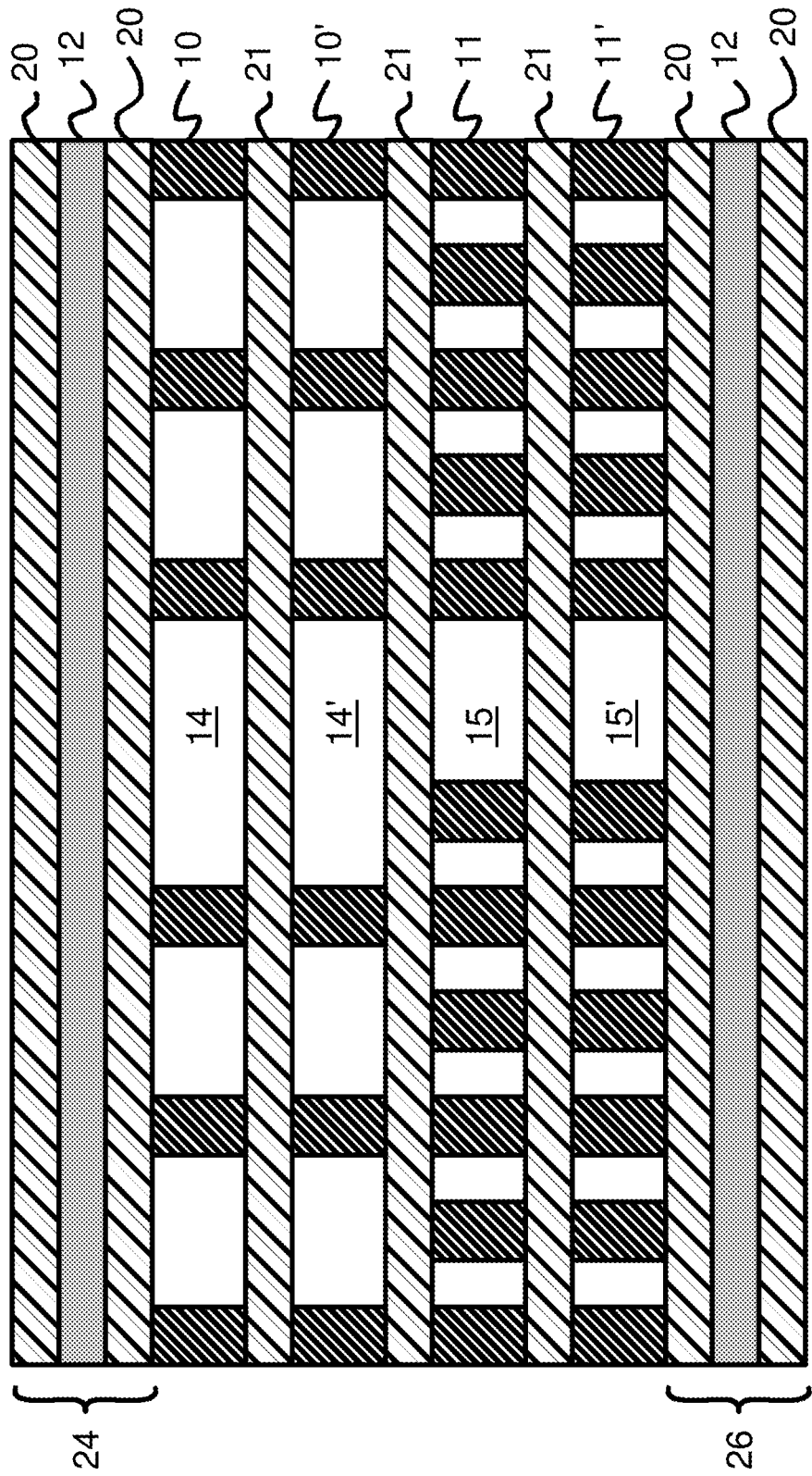
FIG. 15 is a cross section of another alternative shielded-transformer semiconductor package with four coils.

FIG. 15 is a cross section of an alternative shielded-transformer semiconductor package with four coils. Upper transformer coils 10, 10' have fewer windings or turns than lower transformer coil 11, 11'. When primary current is applied to upper transformer coils 10, 10', a voltage is induced by mutual inductance in lower transformer coils 11, 11', which act as the secondary.

Upper transformer coils 10, 10' could be connected in series or parallel, and lower transformer coils 11, 11' could likewise be connected in series or parallel, as described earlier for FIG. 14.

In this variation, middle ferrite-dielectric shield 28 is replaced by dielectric laminate layer 21, so there is no ferrite shielding between the coils. Instead, dielectric laminate layer 21 is between each adjacent pair of coils.

Also, upper transformer coils 10, 10' are stacked together, while lower transformer coils 11, 11' are stacked together separate from upper transformer coils 10, 10'. Since there is no intervening ferrite layer 13, mutual inductance is high among all four coils 10, 10', 11, 11'. Ferrite layers 12 in upper ferrite-dielectric shield 24 and in lower ferrite-dielectric shield 26 act to concentrate the magnetic flux between upper ferrite-dielectric shield 24 and lower ferrite-dielectric shield 26, increasing the mutual inductance of any coils situated between them.

Figure 16:
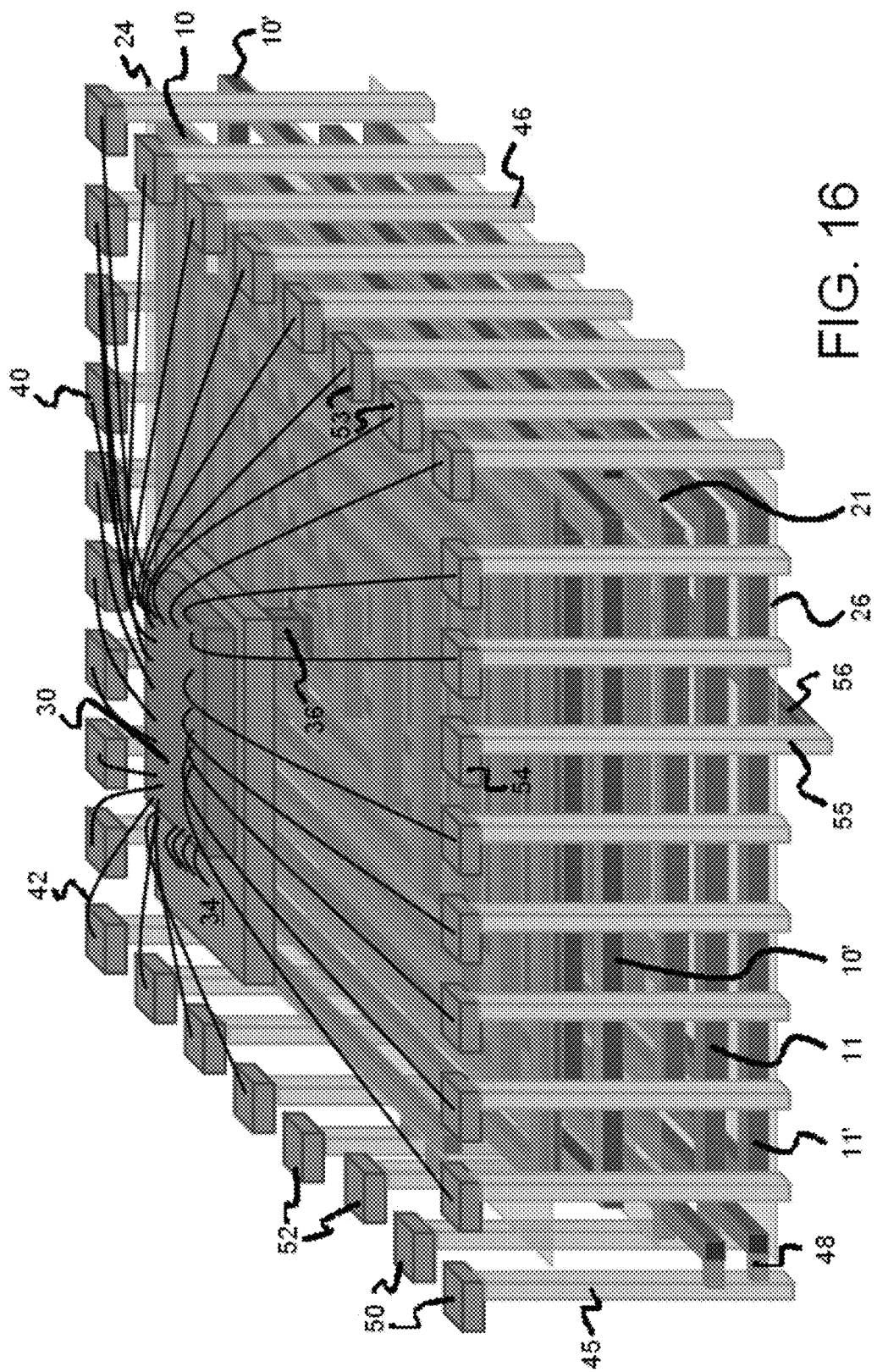
FIG. 16 is a 3D diagram of a four-coil shielded-transformer semiconductor package.

FIG. 16 is a 3D diagram of a four-coil shielded-transformer semiconductor package. In this embodiment, as in FIG. 15, there are four layers of coils, upper transformer coils 10, 10' and lower transformer coils 11, 11, that are stacked in that order. Dielectric laminate layer 21 separate each coil layer from its neighboring coil layer. Only one dielectric laminate layer 21 is shown, between upper transformer coil 10' and lower transformer coil 11, but another dielectric laminate layer 21 (not shown) is present between upper transformer coils 10, 10', and between lower transformer coils 11, 11.

The spacing between transformer coils 10, 10', 11, 11' is expanded in FIG. 16 to allow for better viewing, but would be much closer such as shown in the cross section FIG. 15. Thus a relatively flat, low-profile package can be obtained, even when there are four layers of transformer coils 10, 10', 11, 11'.

Semiconductor chip 30 is attached to die attach pad 34 such as by epoxy or other bonding. Bonding wires 42 are routed between bonding pads on semiconductor chip 30 and lead-frame pads 40, 53. A few bonding wires are routed from bonding pads on semiconductor chip 30 to die attach pad 34.

Lead-frame pads 40, 50, 52, 53, 54 sit atop lead-frame risers 45, 46, 55 that connect to package pins that protrude out the bottom of the package and can fit in holes in a PCB when being soldered to the PCB of the larger system. Lead-frame risers 45, 46, 55 may be bent or connect to other parts of the lead frame (not shown) that lead to the external package pins, bonding balls, or other external connectors (not shown).

Lead-frame risers 45, 46, 55 form a rectangle that surrounds semiconductor chip 30, die attach pad 34, and transformer coils 10, 10', 11, 11'. Transformer coil 10 is covered on the top by upper ferrite-dielectric shield 24. Lower ferrite-dielectric shield 26 is attached to the bottom of lower transformer coil 11'.

The bottom of die attach pad 34 is connected to center post 36 that fits through a central opening in upper ferrite-dielectric shield 24 near air core 14. This opening in upper ferrite-dielectric shield 24 allows center post 36 to connect die attach pad 34 to the central winding of transformer coil 10. Center post 36 can extend downward and connect to the central winding of both upper transformer coils 10, 10' when transformer coils 10, 10' are in a parallel electrical connection.

Upper transformer coils 10, 10' are connected in series, with the center of upper transformer coil 10 connected through center post 36 to semiconductor chip 30, and the outer winding of upper transformer coil 10 connected to the inner winding of upper transformer coil 10', through coil extensions to lead-frame risers to lead-frame pads 52, and an additional post (not visible) similar to lower center post 56, but from the lead-frame risers under lead-frame pads 52 to the center winding of upper transformer coil 10'. The outer winding of upper transformer coil 10' connects through coil extensions and lead-frame risers 46 to lead-frame pads 53.

Lower transformer coils 11, 11' are connected in parallel, with the centers of both upper transformer coils 11, 11' connected through lower center post 56 and lead-frame riser 55 to lead-frame pad 54. The outer windings of both lower transformer coils 11, 11' connect coil extension 48 and lead-frame risers 45 to lead-frame pads 50. The induced secondary current flows between lead-frame pads 50, 54.

Lead-frame pads 50, 54, 54 do not receive a bonding wire 42 from semiconductor chip 30 but instead connect to transformer coils 10, 11, 11' through coil extension 48 or other coil extensions. These lead-frame pads 50, 54, 54 serve no function other than for package symmetry and could be deleted.

Thus a mutual inductance is provided by upper transformer coils 10, 10' to lower transformer coils 11, 11', from a primary current from semiconductor chip 30 and the external package pins. When a varying current flows through transformer coils 10, 10', 11, 11', the electromagnetic field generated is shielded from causing EMI in semiconductor chip 30 by upper ferrite-dielectric shield 24.

Alternate Embodiments

Several other embodiments are contemplated by the inventors. For example, the semiconductor chip could be a silicon chip such as a standard CMOS chip, or could be Silicon on another substrate, or other materials such as GaAs. More than one semiconductor chip 30 could be present and more than one transformer. Other packaging technologies could be substituted that use a lead frame or something similar, or are leadless.

Semiconductor chip 30 is an Integrated Circuit (IC) or discrete component such as a MOSFET and can be of various types such as Complementary Metal-Oxide-Semiconductor (CMOS) or BiCMOS. A typical IC has thousands of transistors formed together in semiconductor materials on a substrate that are connected by integrated wiring such as metal traces. Power IC's may have larger but fewer transistors, such as only 10 transistors. Semiconductor chip 30 may have power transistors that connect to the transformer to form a power converter.

While pins and balls have been described for mounting the shielded-transformer semiconductor package to a PCB system board, many variations are possible. The pins may be leads, bent leads, or bent pins, flat surface-mount pads, and could be mounted into holes in the PCB or to pads on the PCB surface.

While the external package pins have been described as being placed around the perimeter of the shielded-transformer semiconductor package, some or all of these pins, balls, or connectors could be in a grid or array, such as in a Ball Grid Array (BGA) package.

While a plastic-encapsulated package has been described, the shielded-transformer semiconductor package could be a ceramic package or a hybrid package. The PCB may be rigid or flexible and may be some other kind of substrate or larger module or holder or frame in the system.

While transformer coil 10 has been shown as extending past upper ferrite-dielectric shield 24 in FIG. 6, upper ferrite-dielectric shield 24 could fully cover transformer coil 10. Upper ferrite-dielectric shield 24 and lower ferrite-dielectric shield 26 could both extend beyond transformer coils 10, 11 and be squished or pinched together to touch each other to seal the perimeter edges of transformer coils 10, 11.

For a typical resonant converter topology, such as a half bridge LLC resonant converter, the number of primary turns to the number of secondary turns (turn ratio) can be about 16:1. This could be implemented using 8 upper transformer coils 10, 10' and one lower transformer coil 11 that has only half as many turns per layer as upper transformer coils 10, 10'. Many other variations are possible, and for different desired input and output voltages.

While a parallel connection of transformer coils 10, 10' have been shown, upper transformer coils 10, 10' could be placed in a series connection using additional lead frame elements or posts that connect the outer winding of upper transformer coil 10 to the center winding of upper transformer coil 10'. Likewise, lower transformer coils 11, 11' could have a series or a parallel connection. Upper transformer coils 10, 10' could be in series while lower transformer coils 11, 11' are in parallel, or vice versa.

Rather than an external connection from transformer coil 10 using lead-frame outer risers 45, an internal connection within the package could be made from the outer winding of transformer coil 10 back to one of lead-frame risers 46 that does not have an external connection, through bonding wires 42 to a bonding pad on semiconductor chip 30. Other internal connections are possible. Connections that are both internal to semiconductor chip 30 and external to a package pin are possible.

Transformer coils 10, 11 are considered to be an air-core transformer since air cores 14, 15 at the center of the planar coil does not have ferrite, even though ferrite layer 12 is above and below the plane of transformer coil 10, increasing the inductance of the coil as would a ferrite core. Center post 36 may be within the air core in the center of transformer coil 10. Since center post 36 is connected to transformer coil 10, it is not considered to be a metal core of transformer coil 10.

Transformer coil 10 is a metal coil and connects to semiconductor chip 30 through center post 36 and die attach pad 34, and on the other end connects to an external package pin through lead-frame outer risers 45, so transformer coil 10 can be considered to be part of the lead frame of the package, along with lead-frame pads 40 and lead-frame risers 46. Thus, transformer coil 10 is integrated with the package lead frame.

There may be more than two upper transformer coils 10, 10', and there may be more than two lower transformer coils 11, 11. The number of coils for the primary and secondary do not have to be the same. While upper transformer coils 10, 10' have been described as the primary, lower transformer coils 11, 11 could serve as the primary instead.

The primary and secondary could share the same ground, or could have separate grounds. When a shared ground is used, an internal connection could be made between primary and secondary coils. When semiconductor chip 30 is part of the primary loop in a power converter, having upper transformer coil 10 as the primary is useful since upper transformer coil 10 is nearer to semiconductor chip 30 than lower transformer coil 11. Alternatively, when semiconductor chip 30 is part of the secondary side circuit of a power converter, upper transformer coil 10 can serve as the secondary since it is closer to semiconductor chip 30, and lower transformer coil 11 can serve as the primary. Various external connections may be made between upper transformer coil 10 or lower transformer coil 11 and the primary-side or secondary-side circuits of a power converter.

EMI generated by current passing through transformer coil 10 and received by metal traces or other components on semiconductor chip 30 is reduced by at least 90% by using ferrite layer 12. The electromagnetic flux is blocked by ferrite layer 12 that is placed between transformer coil 10 and semiconductor chip 30. Dielectric laminate layers 20 prevent shorting of transformer coil 10 to semiconductor chip 30 or to other conductors.

The background of the invention section may contain background information about the problem or environment of the invention rather than describe prior art by others. Thus, inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A semiconductor package with an integrated and shielded lead-frame transformer comprising:
   a semiconductor chip having transistors formed in a semiconductor material and having integrated wiring integrated together on a chip substrate;
   a first transformer coil having a first air core, the first transformer coil being a planar transformer that is substantially in a plane of the first transformer coil, the plane of the first transformer coil being parallel to a plane of the semiconductor chip;
   a second transformer coil having a second air core, the second transformer coil being a planar transformer that is substantially in a plane of the second transformer coil, the plane of the second transformer coil being parallel to the plane of the semiconductor chip;
   an upper ferrite-dielectric shield having a first ferrite layer and a first dielectric layer above the first ferrite layer and a second dielectric layer below the first ferrite layer, the first transformer coil being electrically isolated from the first ferrite layer by the second dielectric layer;
   wherein the upper ferrite-dielectric shield is in a plane parallel to and between the plane of the first transformer coil and the plane of the semiconductor chip;
   a third dielectric layer for electronically isolating the first transformer coil from the second transformer coil, the third dielectric layer being between the first transformer coil and the second transformer coil;
   a plurality of lead-frame pads placed around a perimeter of the first transformer coil and around a perimeter of the second transformer coil and surrounding the semiconductor chip;
   bonding wires that connect the semiconductor chip to the plurality of lead-frame pads;
   a plurality of lead-frame risers that connect the plurality of lead-frame pads to package connectors for electrically connecting to an external system;
   a first center post that connects to an inner end of the first transformer coil and is electrically connected to the semiconductor chip; and
   a first lead-frame outer riser that connects an outer end of the first transformer coil to a first package connector for electrically connecting to the external system;
   a second center post that connects to an inner end of the second transformer coil and connects to a second package connector for electrically connecting to the external system; and
   a second lead-frame outer riser that connects an outer end of the second transformer coil to a third package connector for electrically connecting to the external system.

2. The semiconductor package with the integrated and shielded lead-frame transformer of claim 1 wherein current flowing through the first transformer coil between the inner end and the outer end of the first transformer coil generates electromagnetic flux that is at least 90% shielded from the semiconductor chip by the first ferrite layer;
   wherein the electromagnetic flux generated by the current flowing through the first transformer coil generates an induced current flowing through the second transformer coil;
   whereby the first ferrite layer reduces Electro-Magnetic Interference (EMI) generated by the first transformer coil and received by the semiconductor chip by at least 90%.

3. The semiconductor package with the integrated and shielded lead-frame transformer of claim 2 wherein the plurality of lead-frame risers pass through the plane of the first transformer coil outside of the perimeter of the first transformer coil;
   wherein the plurality of lead-frame risers pass through the plane of the second transformer coil outside of the perimeter of the second transformer coil.

4. The semiconductor package with the integrated and shielded lead-frame transformer of claim 3 further comprising:
   a lower ferrite-dielectric shield having a second ferrite layer and a fourth dielectric laminate layer above the second ferrite layer and a fifth dielectric laminate layer below the second ferrite layer, the second transformer coil being electrically isolated from the second ferrite layer by the fourth dielectric laminate layer;
   wherein the lower ferrite-dielectric shield is in a lower plane parallel to and below the plane of the second transformer coil and the plane of the first transformer coil and the plane of the semiconductor chip.

5. The semiconductor package with the integrated and shielded lead-frame transformer of claim 4 further comprising:
   a die attach pad that a bottom of the semiconductor chip is attached to;
   wherein the first center post electrically connects to the semiconductor chip through the die attach pad.

6. The semiconductor package with the integrated and shielded lead-frame transformer of claim 5 further comprising:
   bonding wires from the semiconductor chip to the die attach pad to make electrical connection from the semiconductor chip to the die attach pad and through the center post to the first center end of the first transformer coil.

7. The semiconductor package with the integrated and shielded lead-frame transformer of claim 6 wherein the package connectors comprise bonding balls for soldering to pads on a Printed Circuit Board (PCB).

8. The semiconductor package with the integrated and shielded lead-frame transformer of claim 6 wherein the first air core is in a center of the first transformer coil, wherein the first center post fits through a hole in the upper ferrite-dielectric shield above the first air core to connect the semiconductor chip to the inner end of the first transformer coil;

wherein the second air core is in a center of the second transformer coil;

wherein the first transformer coil and the second transformer coil form an air-core transformer.

9. The semiconductor package with the integrated and shielded lead-frame transformer of claim 8 wherein the second center post further comprises a span that connects from a center of the second transformer coil to a lead-frame riser that is outside of an outer winding of the second transformer coil, the span being above or below a plane of the second transformer coil.

10. The semiconductor package with the integrated and shielded lead-frame transformer of claim 8 further comprising:

a third transformer coil having a third air core, the third transformer coil being a planar transformer that is substantially in a plane of the third transformer coil, the plane of the third transformer coil being parallel to a plane of the semiconductor chip;

wherein the first center post further extends downward from the inner end of the first transformer coil to an inner end of the third transformer coil;

wherein the first lead-frame outer riser further comprises a coil riser that connects to an outer end of the third transformer coil;

wherein the first transformer coil and the third transformer coil are connected in parallel between the semiconductor chip and the first lead-frame outer riser.

11. The semiconductor package with the integrated and shielded lead-frame transformer of claim 8 further comprising:

a third transformer coil having a third air core, the third transformer coil being a planar transformer that is substantially in a plane of the third transformer coil, the plane of the third transformer coil being parallel to a plane of the second transformer coil;

a third center post that connects to an inner end of the third transformer coil and connects to the second package connector; and a third lead-frame outer riser that connects an outer end of the third transformer coil to a third package connector for electrically connecting to the external system;

wherein the third transformer coil is connected in series with the second transformer coil.

\* \* \* \* \*